(12) United States Patent
Umetsu et al.

(10) Patent No.: US 11,837,685 B2
(45) Date of Patent: Dec. 5, 2023

(54) DIMMING AGENT AND LIGHT-EMITTING DEVICE CONTAINING DIMMING AGENT

(71) Applicant: SANKEN ELECTRIC CO., LTD., Niiza (JP)

(72) Inventors: Yousuke Umetsu, Niiza (JP); Kazuyoshi Haga, Niiza (JP)

(73) Assignee: SANKEN ELECTRIC CO., LTD., Niiza (JP)

(*) Notice: Subject to any disclaimer, the term of this patent is extended or adjusted under 35 U.S.C. 154(b) by 0 days.

(21) Appl. No.: 17/944,263

(22) Filed: Sep. 14, 2022

(65) Prior Publication Data

US 2023/0006111 A1 Jan. 5, 2023

Related U.S. Application Data

(63) Continuation of application No. PCT/JP2020/029632, filed on Aug. 3, 2020.

(51) Int. Cl.
*H01L 33/50* (2010.01)
*G02B 5/22* (2006.01)

(52) U.S. Cl.
CPC .............. *H01L 33/504* (2013.01); *G02B 5/22* (2013.01)

(58) Field of Classification Search
CPC ....................... G02B 5/0242; H01L 2933/0091
See application file for complete search history.

(56) References Cited

U.S. PATENT DOCUMENTS

| 2006/0176429 | A1* | 8/2006 | Watchi | G02B 5/0278 349/119 |
| 2011/0188266 | A1* | 8/2011 | Sano | H01L 27/15 257/89 |
| 2012/0161090 | A1* | 6/2012 | Zhu | C01G 23/047 252/587 |
| 2014/0021493 | A1* | 1/2014 | Andrews | H01L 33/60 257/E33.068 |
| 2016/0372639 | A1 | 12/2016 | Mueller et al. | |

FOREIGN PATENT DOCUMENTS

| JP | H4-298956 | A | 10/1992 |
| JP | H9-156964 | A | 6/1997 |
| JP | 2005-272280 | A | 10/2005 |
| JP | 2008-103235 | A | 5/2008 |
| JP | 2017-527114 | A | 9/2017 |
| WO | 2019/180959 | A1 | 9/2019 |

OTHER PUBLICATIONS

The International Search Report of PCT/JP2020/029632 dated Oct. 13, 2020.

* cited by examiner

Primary Examiner — Andrew J Coughlin
(74) Attorney, Agent, or Firm — METROLEX IP LAW GROUP, PLLC

(57) ABSTRACT

A dimming agent according to one or more embodiments is disclosed that may include at least one of terbium, praseodymium, manganese, titanium. A diffuse reflection intensity of the dimming agent in a wavelength of from 400 nm to 750 nm may be 80% or less.

5 Claims, 6 Drawing Sheets

DIMMING AGENT AND LIGHT-EMITTING DEVICE CONTAINING DIMMING AGENT

CROSS REFERENCE TO RELATED APPLICATIONS

This application claims priority based on 35 USC 119 from prior International Patent Application No. PCT/JP2020/029632 filed on Aug. 3, 2020, the entire contents of which are incorporated herein by reference.

BACKGROUND

The disclosure relates to a dimming agent and a light-emitting device containing a dimming agent.

Highly efficient LEDs have been developing to save energy. On the other hand, LEDs used in dark environments, such as for in-vehicle applications, etc., need to be less glaring so as not to interfere with the driver's vision.

For example, JP2008-103235 ("Nishikawa") describes an invention relating to a light reduction circuit that switches a light intensity of an automotive LED.

As illustrated in FIG. 10, it is possible to adjust the brightness by changing the injection current to LEDs using a light-reduction circuit, etc., as described in Nishikawa. However, there is a problem that an emission wavelength of blue LEDs fluctuates significantly when the injection current to the LEDs is lowered. If the emission wavelength of the blue LEDs changes, the chromaticity of the white LEDs varies.

SUMMARY

A dimming agent according to one or more embodiments may contains at least one of terbium, praseodymium, manganese, and titanium. A diffuse reflection intensity of the dimming agent in a wavelength of from 400 nm to 750 nm may be 80% or less.

According to one or more embodiments, the dimming agent, the brightness of the light-emitting device may be reduced to a low level without reducing the current value of the current injected into the LED. As a result, a change in an emission wavelength of the LED, i.e., a change in chromaticity, may be suppressed, making the light-emitting device suitable for use in a dark environment, such as for in-vehicle use, etc.

In one or more embodiments, a dimming agent may contain an alkali earth metal as a constituent element and at least one of terbium, praseodymium, manganese, and titanium. A diffuse reflection intensity of the dimming agent in a wavelength of from 400 nm to 750 nm may be 80% or less.

Thus, a matrix material of the dimming agent may be designed in the same way as a phosphor containing an alkaline earth metal. Terbium, praseodymium, manganese, and titanium may also be added like a phosphor additive. By designing the dimming agent like a phosphor, the specific gravity and a particle size may be controlled and adjusted as a factor in uniform dispersion with the phosphor.

In one or more embodiments, a light-emitting device may include the dimming agent and may have its emission peak wavelength of the light-emitting device in a 380-490 nm range.

Therefore, the light-emitting device has various brightness (light intensity) and may reduce brightness without reducing the current value of the current injected into the LED.

The light-emitting device may include the dimming agent and the phosphor and may have an emission peak wavelength of a light-emitting element in the 380-490 nm range.

According to one or more embodiments, the current value of the current injected into the LED may not be lowered and the brightness is kept low. Therefore, a change in the emission wavelength of the LED, i.e., a change in chromaticity, may be suppressed, making the light-emitting device suitable for use in a dark environment, such as for in-vehicle use, etc.

DETAILED DESCRIPTION

Figure 1:
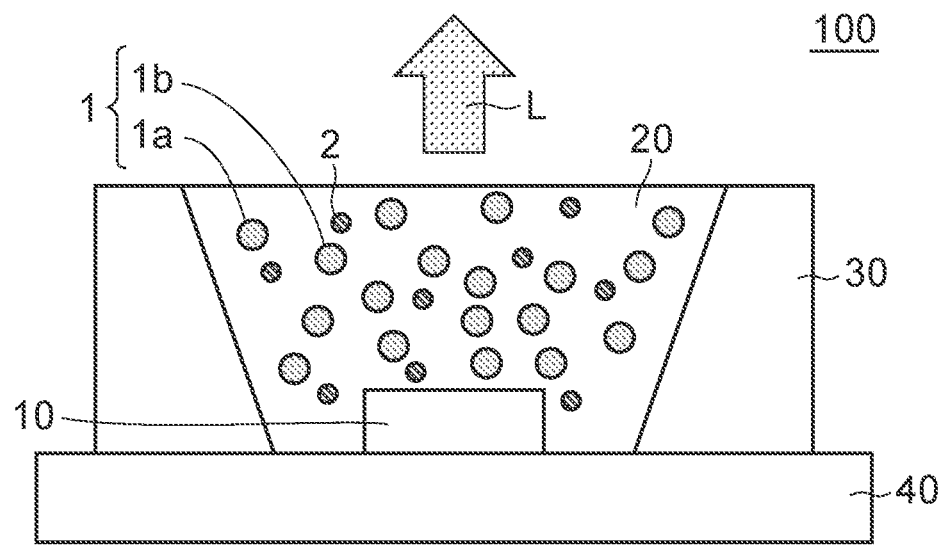
FIG. 1 is a diagram illustrating a light-emitting device according to one or more embodiments.

A dimming agent and a light-emitting device containing a dimming agent according to one or more embodiments are described, but the invention is not limited to the one or more embodiments described herein.

There is a need for a light-emitting device with reduced brightness without reducing the current value of the current injected into the LED.

The inventors, after careful consideration of the above-mentioned problem, found that a dimming agent with the diffuse reflection intensity of 80% or less at a wavelength from 400 nm to 750 nm and containing at least one of terbium, praseodymium, manganese, and titanium may provide a light-emitting device with low brightness without reducing the current value of an injection current to the LED.

The inventors also found that a light-emitting device may include a light-emitting element, a dimming agent as described in claims 1 and 2 that absorbs a portion of the light from the light-emitting element, and a phosphor that absorbs a part of the light from the light-emitting element and converts the light into light with an emission peak wavelength different from the peak wavelength of the emission wavelength of the light-emitting element.

The following is explained with reference to the figures and tables included herein.

As mentioned above, a light-emitting device used in a dark environment, such as a white LED for an automotive use, is required to be bright enough to be recognized under sunlight during the daytime and not too glaring during the nighttime. A white LED for a nighttime use with a light intensity of 300 mcd is a most common example. However, from the viewpoint of safety at night, especially for a white LED for automotive use placed close to a driver, the market is looking for LEDs with a light intensity of 120 mcd or less, in particular, white LEDs with light intensity of 100 to 10 mcd are demanded. If such a light-emitting device with light intensity of 120 mcd or less is to be achieved by lowering the injection current in a traditional way, the emission wavelength (peak wavelength) of a blue LED varies, and the chromaticity of a white LED changes as described above.

One solution is to use a conventional blue LED with low luminous efficiency. However, as the technological trend is toward higher efficiency blue LEDs, there are no manufacturers that may supply blue LEDs with low luminous efficiency at a stable quality and at a low price. Therefore, it is necessary to develop a technology to manufacture dark LEDs based on high-efficiency, high-quality, and low-cost blue LEDs that are widely available in the market.

As a result of the inventors' diligent study, the present inventors have developed a white LED with a light intensity of 30 mcd or lower by using a light-emitting element, a dimming agent that absorbs a portion of the light from the light-emitting element, contains at least one of terbium, praseodymium, manganese, and titanium, and has 80% or less of the diffuse reflection intensity of a wavelength of 400 nm to 750 nm, and a phosphor that absorbs a part of the light from the light-emitting element and converts the light into light with an emission peak wavelength different from the peak wavelength of the emission wavelength of the light-emitting element.

As described below in detail, the light-diminishing effect of terbium and praseodymium is weak when trivalent rare earth elements are included as constituent elements of the dimming agent. Therefore, matrix crystals containing divalent alkaline earth metals are preferable.

FIG. 1 is a diagram illustrating an example of a light-emitting device 100 according to present embodiments. The light-emitting device 100 according to one or more aspects includes a light-emitting element 10 provided on a substrate 40 and a dimming agent 2 that absorbs a portion of the light from the light-emitting element 10. The dimming agent 2 is dispersed in a resin layer 20 that serves as a resin sealant covering the light-emitting element 10 and stored in a package 30. In the resin layer 20, an additive such as Aerosil may be added as needed to enhance the dispersibility of the dimming agent 2, etc.

For the light-emitting element 10, an emission peak wavelength is in a 380 to 490 nm range. Such light-emitting element emits blue light and is relatively readily available with high quality and low cost. The dimming agent 2 contains at least one of terbium, praseodymium, manganese, and titanium and has a diffuse reflection intensity of 80% or less at a wavelength from 400 nm to 750 nm. The use of the dimming agent 2 results in a blue light-emitting device with reduced brightness without lowering the current value of the current injected into the LED.

The resin layer 20 may include a phosphor 1 (1a, 1b). By changing the emission wavelength of the phosphor 1, the inventors discovered that a dark light-emitting device may be created that exhibits not only white but also various emission colors such as green, yellow, and red.

In an experiment, an embodiment or embodiments, and a comparative example (CE) described below, a blue LED with an output of 60 mcd and a dominant wavelength of 458 nm when 5 mA of current is applied is used as the light-emitting element 10.

Dimming Agent

Figure 2:
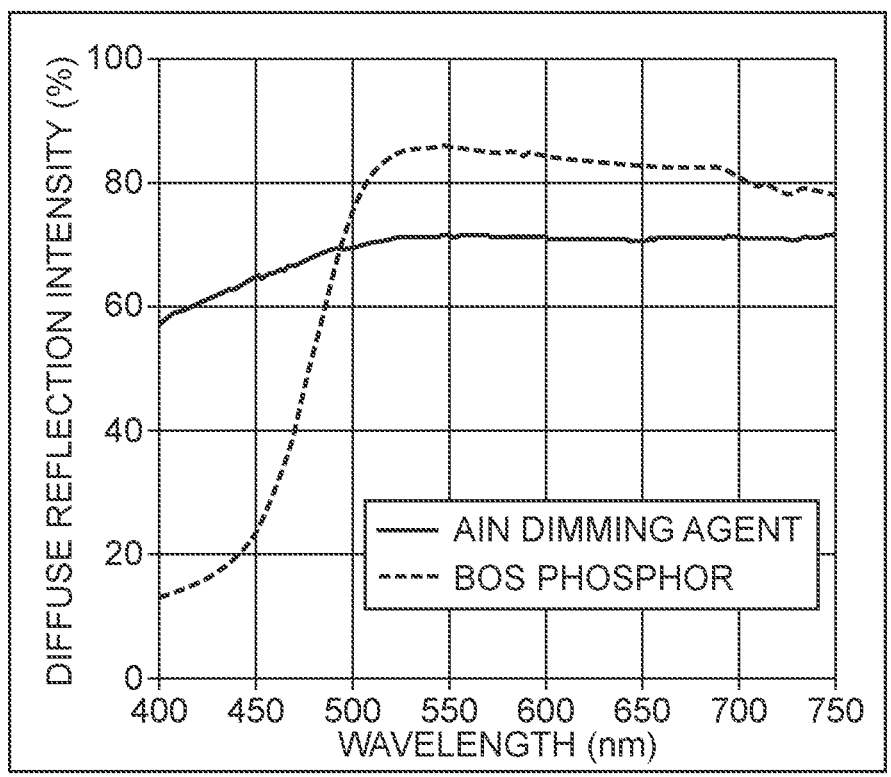
FIG. 2 is a diagram illustrating diffuse reflection spectra of an AlN dimming agent and a BOS phosphor.

The following explanation relates to a dimming agent. A diffuse reflection spectrum of a currently used dimming agent is illustrated in FIG. 2. For a comparison, a commercial product with an emission peak wavelength of 530 nm $(Ba, Sr)_2SiO_4$:Eu phosphor (hereinafter referred to as BOS phosphor) is illustrated in FIG. 2. The BOS phosphor selectively absorbs light with 500 nm or lower, whereas an AlN dimming agent absorbs light uniformly from 400 nm to 750 nm.

However, the light absorption of the AlN dimming agent is not very strong. Making 30 mcd or less with a white LED increases the used amount of AlN dimming agent. However, as a powder concentration in a resin increases, a resin viscosity increases, making uniform application difficult.

Figure 3:
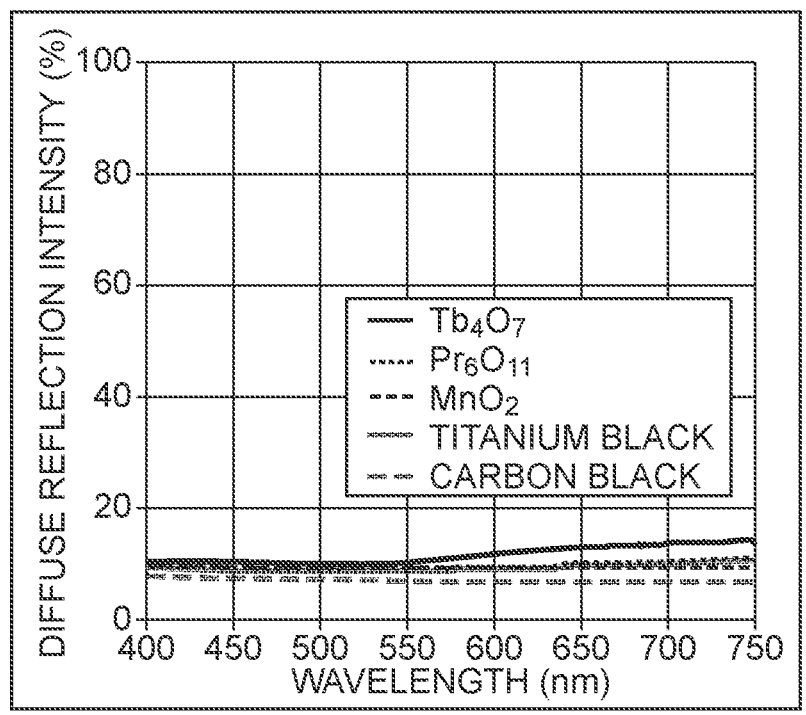
FIG. 3 is a diagram illustrating diffuse reflection spectra of body-colored dark powders.

Therefore, a development of a new dimming agent is sought. FIG. 3 illustrates the diffuse reflectance spectra of body-colored dark powders. Terbium oxide ($Tb_4O_7$), praseodymium oxide ($Pr_4O_{11}$), and manganese oxide ($MnO_2$) are commonly used materials when making a phosphor, and terbium oxide ($Tb_4O_7$), praseodymium oxide ($Pr_4O_{11}$), and manganese oxide ($MnO_2$) indicate strong optical absorption in a wide range of wavelengths from 400 nm to 750 nm. Titanium is also used in various compounds as a raw material for a phosphor, a photocatalyst and a pigment. A typical titanium black is titanium oxynitride, which also indicates strong optical absorption in a wide range of wavelengths from 400 nm to 750 nm. As a comparison, a carbon black powder used in an automobile tire also indicates strong optical absorption in a wide range of wavelengths from 400 nm to 750 nm.

When the dimming agent with a dark body-colored is added to a white LED, a small amount of the diming agent greatly diminishes the white LED. From the workability at the time of weighing, a dimming agent that may be added in a certain amount is required.

A specific gravity and a particle size of each particle may preferably be adjusted in order to uniformly disperse the phosphor and dimming agent in the resin.

Specific Gravity of Diminishing Agent

The specific gravity of a material is determined by its constituent element and crystal structure. Therefore, it is difficult to change the specific gravity of a phosphor while maintaining the luminescence characteristic. As illustrated in Table 1, phosphors use relatively heavy elements (e.g., alkaline earth metals and rare earth elements) and therefore have relatively high specific gravities. AlN and similar body-colored $Si_3N_4$ powders are made of relatively light elements and therefore have relatively low specific gravities.

The specific gravity of each material, referenced from the Inorganic Crystal Structure Database (ICSD), is listed in Table 1.

TABLE 1

| Material | Specific Gravity (g/cm$^3$) | Reference |
|---|---|---|
| AlN | 3.38 | ICSD #82789 |
| Si$_3$N$_4$ | 3.43 | ICSD #97567 |
| Ca$_2$SiO$_4$ | 2.96 | ICSD #200707 |
| Sr$_2$SiO$_4$ | 4.51 | ICSD #35667 |
| Ba$_2$SiO$_4$ | 5.49 | ICSD #38155 |
| Y$_3$Al$_5$O$_{12}$ | 4.57 | ICSD #93635 |

The specific gravity of the dimming agent may be adjusted by selecting a crystal matrix of the dimming agent.

Attenuation Rate

An attenuation rate (an absorption rate) may be increased by increasing the amount of a doping element.

The main point is that the selection of the matrix material and impurity doping may be configured in the same way as a phosphor with a luminescent center (an impurity) added.

Particle Size of a Dimming Agent

A particle growth of a phosphor may be controlled by the particle size of the raw material used and the temperature and time of firing. By using the crystal matrix used in a phosphor as a dimming agent, a manufacture in the same way as a phosphor may be done. Therefore, the particle size of the dimming agent may be easily adjusted.

From the above, by adding elements (terbium, praseodymium, manganese, and titanium) that cause light absorption to the same crystal matrix as the phosphor, a white LED with 30 mcd or lower may be provided.

A valence of an element causing an optical absorption is considered.

Terbium oxide (Tb$_4$O$_7$) is a mixture of Tb$_2$O$_3$ and TbO$_2$ and contains trivalent and tetravalent Tb. The body color is brownish brown. For trivalent Tb, LaPO$_4$:Ce$^{3+}$, Tb$^{3+}$ (LAP) are well known as green phosphors for fluorescent lamps. The green phosphor has a white body color and shows weak light absorption in a visible light region. The visible light absorption of terbium oxide (Tb$_4$O$_7$) is therefore attributed to tetravalent Tb.

On the other hand, praseodymium oxide (Pr$_4$O$_{11}$) is also a mixture of Pr$_2$O$_3$ and PrO$_2$ and contains trivalent and tetravalent Pr. The body color is dark gray. Pr in praseodymium fluoride (PrF$_3$) is trivalent, and its powder has a green body color. Therefore, the black body color may be attributed to the tetravalent Pr.

Mn in manganese oxide (MnO$_2$) is tetravalent based on its chemical formula. The body color is gray, and its light absorption is thought to be due to tetravalent Mn.

Terbium and praseodymium tend to be trivalent and tetravalent. When the crystal matrix contains trivalent rare earth ion as a constituent element, terbium and praseodymium tend to exist as trivalent. Therefore, the crystal matrix containing a divalent alkaline earth metal is selected.

Preparation of a Dimming Agent

The same matrix as the well-known phosphor (Ba, Sr, Ca)$_2$SiO$_4$:Eu is used as an example. The matrix may be (Ba, Sr, Ca)$_3$SiO$_5$, (Ba, Sr, Ca)$_3$MgSi$_2$O$_8$, etc., but it is not limited to.

First Embodiment

For raw materials for the dimming agent, barium carbonate (BaCO$_3$), strontium carbonate (SrCO$_3$), terbium oxide (Tb$_4$O$_7$), and silicon oxide (SiO$_2$) are used. The raw material composition ratios are shown below.

Barium carbonate (BaCO$_3$): 7.451 g
Strontium carbonate (SrCO$_3$): 9.000 g
Terbium oxide (Tb$_4$O$_7$): 0.470 g
Silicon oxide (SiO$_2$): 3.079 g The above raw materials are mixed in a ball mill, filled into an alumina crucible, and fired at 1200° C. for 3 hours. When (Ba, Sr)$_2$SiO$_4$:Eu$^{2+}$ phosphor is calcined, mixed gas of nitrogen and hydrogen is used because a reduction reaction of Eu$^{3+}$→Eu$^{2+}$ is required. However, the Tb$^{4+}$ phosphor is calcined in an atmospheric atmosphere because no reduction reaction is required. In addition, the particle size is adjusted in the same way as for the phosphor to obtain the dimming agent.

Second Embodiment

As in a first embodiment, raw materials are mixed in the following composition ratios.

Barium carbonate (BaCO$_3$): 16.904 g
Terbium oxide (Tb$_4$O$_7$): 0.410 g
Silicon oxide (SiO$_2$): 2.687 g The dimming agent is obtained after calcination and adjustment of the particle size in the same manner.

Third Embodiment

Similarly, raw materials are mixed in the following composition ratios.

Strontium carbonate (SrCO$_3$): 16.095 g
Terbium oxide (Tb$_4$O$_7$): 0.517 g
Silicon oxide (SiO$_2$): 3.389 g The dimming agent is obtained after calcination and adjustment of the particle size in the same manner.

Comparative Example 1 (CE1)

Similarly, raw materials are mixed in the following composition ratios.

Barium carbonate (BaCO$_3$): 7.487 g
Strontium carbonate (SrCO$_3$): 9.420 g
Silicon oxide (SiO$_2$): 3.094 g The dimming agent is obtained after calcination and adjustment of the particle size in the same manner.

Measurement of a Diffuse Reflection Spectrum

Diffuse reflection spectra are obtained using the integrating sphere unit of the spectrophotometer FP-6500 manufactured by Japan Spectrophotometer Co. The diffuse reflection spectrum of the prepared dimming agent is obtained by setting a reflection intensity against the spectralon of a standard white plate as 100%.

Figure 4:
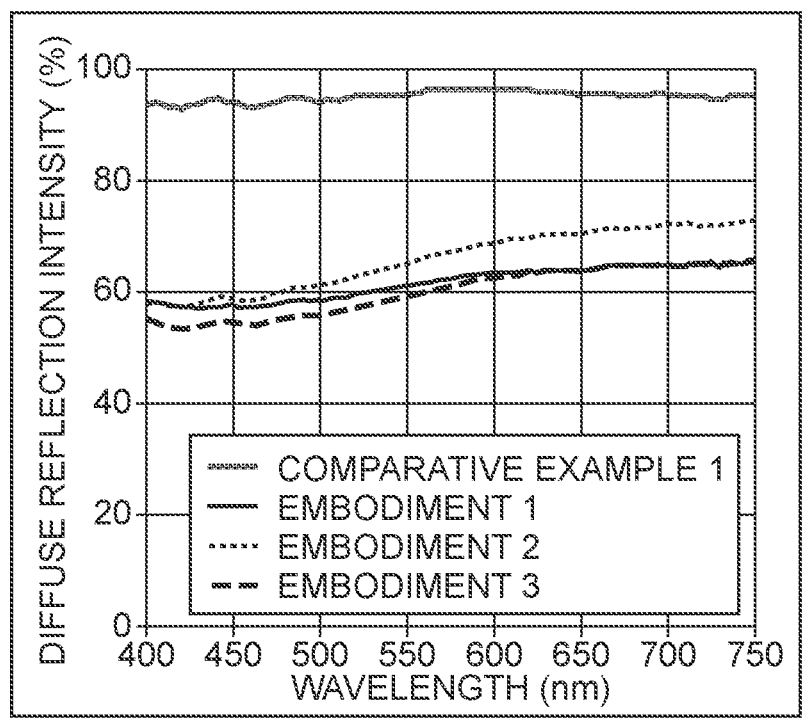
FIG. 4 is a diagram illustrating diffuse reflection spectra of a comparative example 1 and of a first, second and third embodiment or embodiments.

FIG. 4 is a diagram illustrating diffuse reflection spectra of the dimming agents of Embodiments 1 to 3 and the powder of Comparative Example 1 without terbium. The light absorbance of the dimming agent containing terbium is stronger.

Fourth Embodiment

As in a first embodiment, raw materials are mixed in the following composition ratios.

Figure 5:
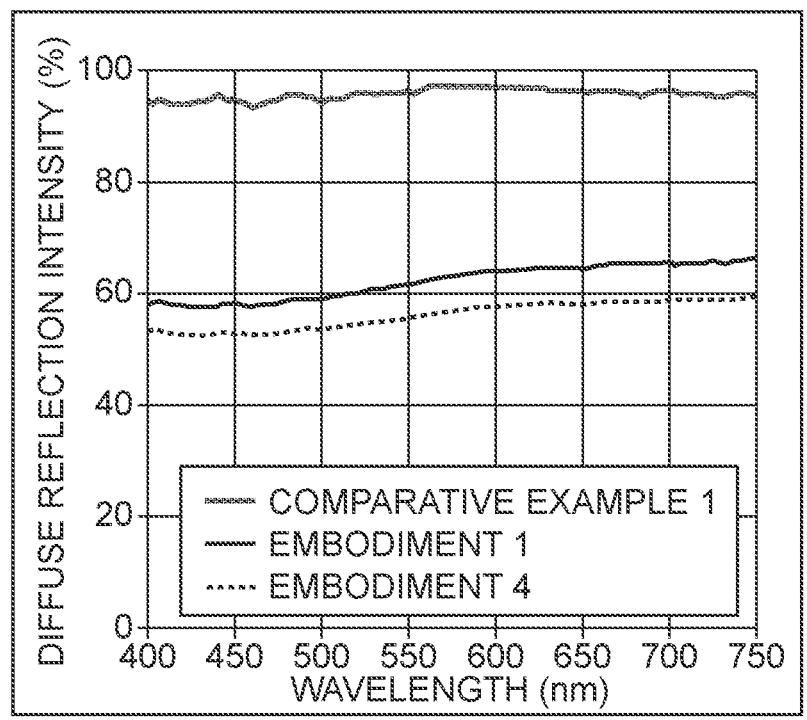
FIG. 5 is a diagram illustrating diffuse reflection spectra of a comparative example 1 and a first and fourth embodiment or embodiments.

Barium carbonate (BaCO$_3$): 8.584 g
Strontium carbonate (SrCO$_3$): 7.416 g
Terbium oxide (Tb$_4$O$_7$): 0.935 g Silicon oxide (SiO$_2$): 3.065 g FIG. 5 is a diagram illustrating powder diffuse reflectance spectra of the dimming agents of a first and fourth embodiment or embodiments and Comparative Example 1 without terbium. The diffuse reflection intensity becomes stronger as the amount of terbium increases, i.e., the optical absorption becomes stronger.

The above-mentioned embodiments illustrate (Ba, Sr)$_2$SiO$_4$ matrix as an example, but other crystal matrices may also be applied in other embodiments. In addition to terbium, praseodymium, manganese, and titanium may also be doped to cause similar optical absorption and may be used as a dimming agent.

In an experiment, an embodiment or embodiments, and a comparative example described below, a blue light-emitting device with an output of 60 mcd and a dominant wavelength of 458 nm when 5 mA of current is applied is used as a light-emitting device 10.

Comparative Example 2 (CE2)

Figure 6:
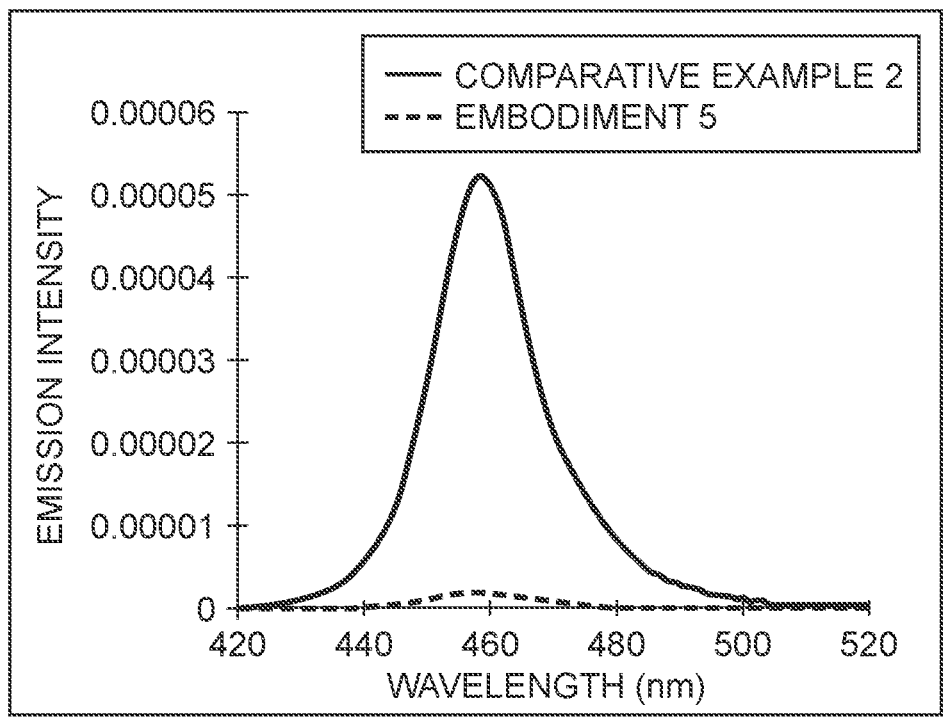
FIG. 6 is a diagram illustrating emission spectra of a comparative example 2 and a fifth embodiment or embodiments.
Figure 7:
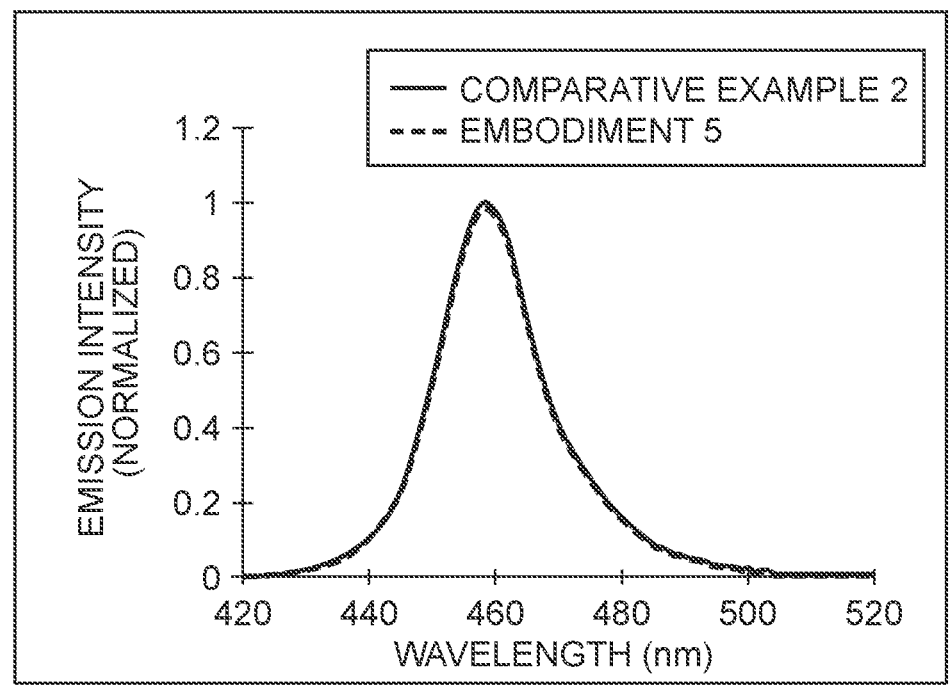
FIG. 7 is a diagram illustrating normalized emission spectra of a comparative example 2 and a fifth embodiment or embodiments.

A blue light-emitting element 10 is covered with a thermosetting silicone resin encapsulant 20 to make a blue light-emitting device 100A. Silicone resin composition ratios are shown below.
Silicone resin A (main agent): 0.5000 g
Silicone resin B (curing agent): 0.5000 g Fifth Embodiment A blue light-emitting device 100B is made by being covered with the blue light-emitting element 10 and the thermosetting silicone resin encapsulant 20 containing the dimming agent powder 2 of a fourth embodiment or embodiments. Aerosil is added to the encapsulant 20 to prevent sedimentation of the dimming agent. Material composition ratios are shown below.
Silicone resin A (main agent): 0.5000 g
Silicone resin B (curing agent): 0.5000 g
Aerosil: 0.0150 g
The dimming agent of a fourth embodiment or embodiments: 0.3390 g Table 2 illustrates luminescence characteristics of the light-emitting devices according to Comparative Example 2 and a fifth embodiment or embodiments. The emission spectra of the light-emitting devices according to Comparative Example 2 and a fifth embodiment or embodiments are illustrated in FIG. 6, and the normalized emission spectra are illustrated in FIG. 7. The blue light-emitting device according to a fifth embodiment or embodiments is sufficiently smaller than that of the comparative example.

TABLE 2

|  | Luminosity (mcd) | Chromaticity x | Chromaticity y |
|---|---|---|---|
| CE 2 | 61.9 | 0.142 | 0.041 |
| Fifth Embodiment | 2.1 | 0.142 | 0.041 |

Comparative Example 3 (CE 3)

The blue light-emitting element 10 and a (Ba, Sr)$_2$SiO$_4$:Eu$^{2+}$ phosphor (hereinafter referred to as a BOS phosphor) with an emission peak wavelength of 565 nm as a phosphor 1a are covered with a thermosetting silicone resin encapsulant 20 to make a white light-emitting device 100. Material composition ratios are shown below.
Silicone resin A (main agent): 0.5000 g
Silicone resin B (curing agent): 0.5000 g
Aerosil: 0.0150 g
BOS phosphor (565 nm): 0.3308 g Comparative Example 4 (CE 4)

A white light-emitting device is made as in Comparative Example 3. AlN is used as a dimming agent to reduce brightness. The BOS phosphor with an emission peak wavelength of 530 nm is used as a phosphor 1b to adjust the chromaticity of the white color. The BOS phosphor is formulated to have the same chromaticity as in Comparative Example 3. Material composition ratios are shown below.
Silicone resin A (main agent): 0.5000 g
Silicone resin B (curing agent) 0.5000 g
Aerosil: 0.0150 g
BOS phosphor (530 nm): 0.0093 g
BOS phosphor (565 nm): 0.0699 g
AlN: 0.3121 g Comparative Example 5 (CE 5)

Figure 8:
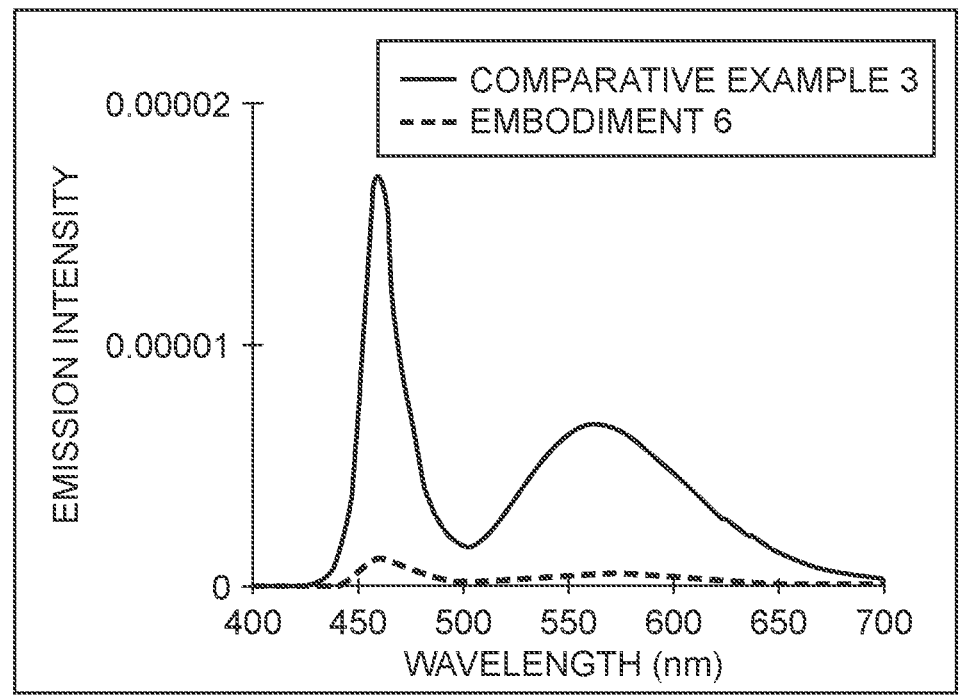
FIG. 8 is a diagram illustrating emission spectra of a comparative example 3 and a sixth embodiment or embodiments.
Figure 9:
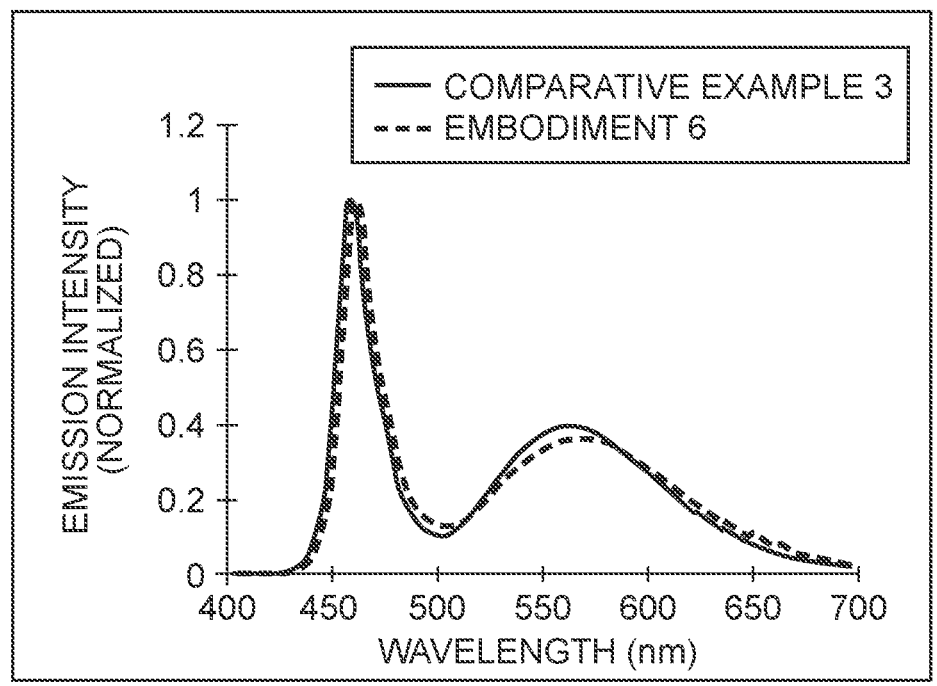
FIG. 9 is a diagram illustrating normalized emission spectra of a comparative example 3 and a sixth embodiment or embodiments.
Figure 10:
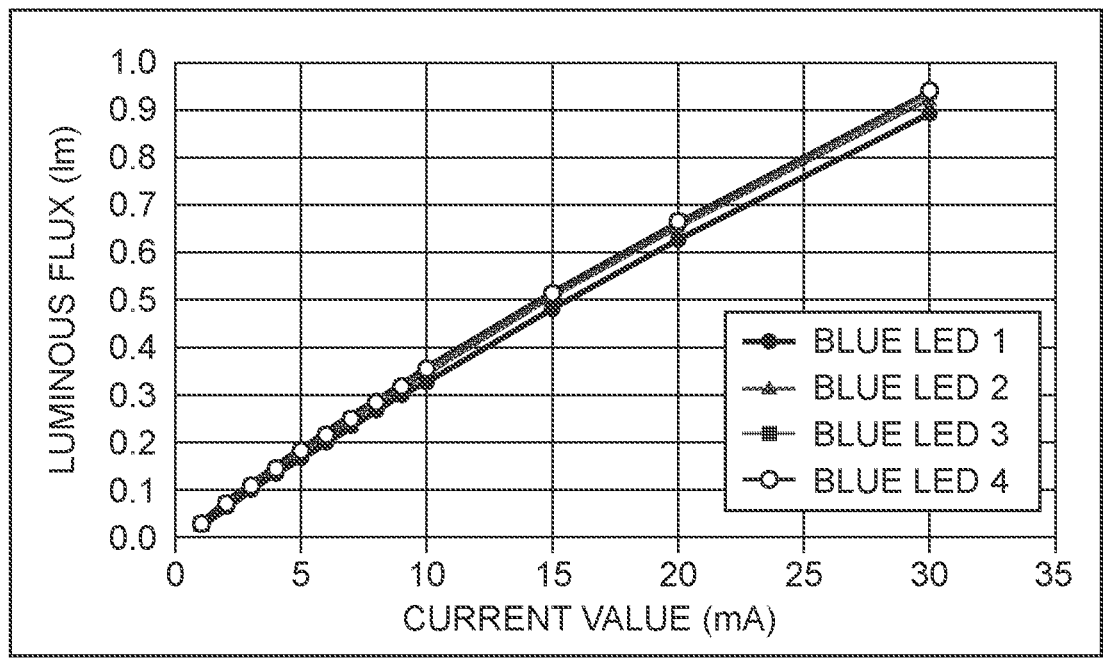
FIG. 10 is an explanatory diagram illustrating how a luminous flux of an LED changes in response to the current injected into the LED.
Figure 11:
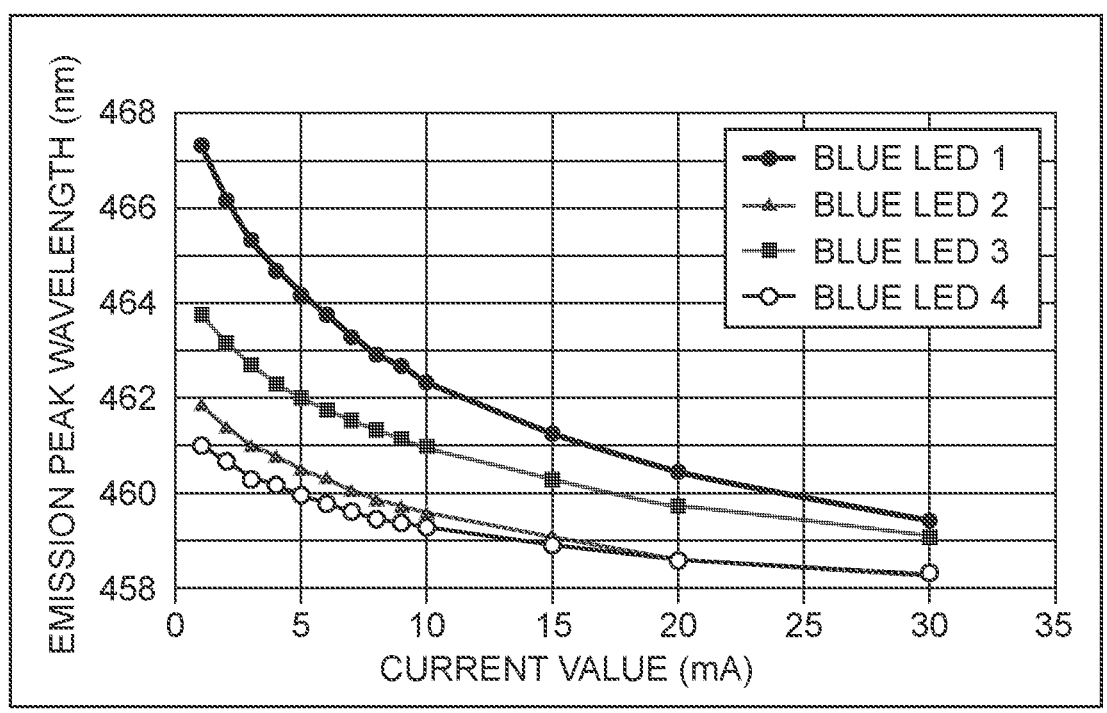
FIG. 11 is a diagram illustrating a variation of an emission wavelength of a blue LED when an injection current to the LED is set to a constant current.

A white light-emitting device is made as in Comparative Example 4. Carbon black is used as a dimming agent to reduce brightness. Material composition ratios are shown below.
Silicone resin A (main agent): 0.5000 g
Silicone resin B (curing agent): 0.5000 g
Aerosil: 0.0150 g
BOS phosphor (565 nm): 0.1624 g
Carbon black: 0.0001 g Sixth Embodiment A white light-emitting device is made as in Comparative Example 5. The dimming agent according to a fourth embodiment or embodiments is used to reduce brightness. Material composition ratios are shown below.
Silicone resin A (main agent): 0.5000 g
Silicone resin B (curing agent): 0.5000 g
Aerosil: 0.0150 g
BOS phosphor (530 nm): 0.0242 g
BOS phosphor (565 nm): 0.1624 g
Dimming agent according to Embodiment 4: 0.1581 g Seventh Embodiment A white light-emitting device is made as in a sixth embodiment or embodiments. Material composition ratios are shown below.
Silicone resin A (main agent): 0.5000 g
Silicone resin B (curing agent): 0.5000 g
Aerosil: 0.0150 g
BOS phosphor (530 nm): 0.0935 g
BOS phosphor (565 nm): 0.4480 g
Dimming agent according to Embodiment 4: 0.3399 g Table 3 illustrates luminescence characteristics of the light-emitting devices according to Comparative Example 3, Comparative Example 4, Comparative Example 5, a sixth embodiment or embodiments, and a seventh embodiment or embodiments. The emission spectra of the light-emitting devices according to Comparative Example 3 and a sixth embodiment or embodiments are illustrated in FIG. 8, and the normalized emission spectra are illustrated in FIG. 9. A sixth embodiment may sufficiently reduce light emission compared to Comparative Example 3.

TABLE 3

|  | Luminosity (mcd) | Chromaticity x | Chromaticity y |
| --- | --- | --- | --- |
| CE 3 | 357 | 0.307 | 0.316 |
| CE 4 | 46 | 0.309 | 0.315 |
| CE 5 | 9 | 0.307 | 0.314 |
| Sixth Embodiment | 69 | 0.305 | 0.315 |
| Seventh Embod. | 26 | 0.308 | 0.314 |

The concentration of a powder 1 (1a, 1b) with respect to the encapsulant 20 is considered. The powder concentration is expressed by the following equation.

Powder concentration [%]=(Powder weight [g])/
(Powder weight [g]+Encapsulated weight [g])

The phosphor concentration and the dimming agent concentration according to Comparative Example 3, Comparative Example 4, Comparative Example 5, and a sixth embodiment, as well as the total powder concentration obtained by adding the phosphor concentration and the dimming agent concentration together, are illustrated in Table 4.

TABLE 4

|  | Phosphor Concentration | Dimming Agent Concentration | Total Powder Concentration |
| --- | --- | --- | --- |
| CE 3 | 24.6% | — | 24.6% |
| CE 4 | 7.2% | 28.5% | 35.7% |
| CE 5 | 50.1% | 0.005% | 50.1% |
| Sixth Embodiment | 15.5% | 13.2% | 28.7% |
| Seventh Embod. | 34.8% | 21.8% | 56.6% |

Table 5 illustrates the percentage of light intensity maintained when the light-emitting devices according to Comparative Example 3, Comparative Example 4, and a sixth embodiment are placed in a 60° C. RH 90% constant temperature and humidity chamber and energized.

TABLE 5

|  | 0 Hour | 240 Hours | 1000 Hours |
| --- | --- | --- | --- |
| CE 3 | 100% | 97% | 94% |
| CE 4 | 100% | 94% | 91% |
| Sixth Embod. | 100% | 97% | 97% |

In Comparative Example 4, a decrease in light intensity is observed. Compared to a sixth embodiment or embodiments, the lower phosphor concentration resulted in a higher excitation density per grain, which is considered to be photo-degradation. In Comparative Example 3, the phosphor excitation density is also high because a dimming agent is not contained, which is considered to result in photo-degradation. In contrast, in a sixth embodiment, the excitation density per grain is lower due to the higher phosphor concentration and the inclusion of a dimming agent, resulting in a light-emitting device with a smaller change in light intensity.

From Comparative Example 5, a black powder such as carbon black causes significant dimming in a small amount. Since carbon black tends to agglomerate easily, some manufacturing ingenuity may be required to ensure uniform dispersion.

A dimming agent according to one or more embodiments may reduce brightness without lowering a current value of a current injected into an LED and a light-emitting device using the dimming agent.

As described above, the use of the dimming agent according to one or more embodiments may result in a light-emitting device with reduced brightness without lowering the current value of the current injected into the LED. In addition, the use of a phosphor may provide a light-emitting device with various brightness in green, yellow, red, and white as well as blue.

One or more embodiments may be adapted to a light-emitting device, etc. with low brightness without reducing the current value of the current injected into the LED.

The invention is not limited to the above embodiments, which are illustrative examples. Any composition that is substantially identical to the technical concept described in the present disclosure and defined in the claims and that achieves similar effects is included in the technical scope of the invention. For example, although the oxide matrix is described as an example for the dimming agent in embodiments, it goes without saying that it is also applicable to halogen compounds, acid halogen compounds, and crystal matrices such as oxynitride, nitride, and sulfide.

The invention claimed is:

1. A dimming agent comprising:
   a crystal matrix comprising an alkali earth metal as a constituent element; and
   at least one of terbium, praseodymium, manganese, and titanium that is doped in the crystal matrix, wherein
   a diffuse reflection intensity of the dimming agent in a wavelength of from 400 nm to 750 nm is 80% or less.

2. A light-emitting device comprising:
   a light-emitting element; and
   the dimming agent according to claim 1, wherein
   a portion of light from the light-emitting element is absorbed.

3. The light emitting device according to claim 2, wherein the crystal matrix of the dimming agent comprises $(Ba, Sr, Ca)_2SiO_4$, $(Ba, Sr, Ca)_3SiO_5$, or $(Ba, Sr, Ca)_3MgSi_2O_8$.

4. The dimming agent according to claim 1, wherein the crystal matrix of the dimming agent comprises $(Ba, Sr, Ca)_2SiO_4$, $(Ba, Sr, Ca)_3SiO_5$, or $(Ba, Sr, Ca)_3MgSi_2O_8$.

5. A light-emitting device comprising:
   a light-emitting element; and
   a dimming agent comprising:
     an alkali earth metal as a constituent element; and
     at least one of terbium, praseodymium, manganese, and titanium, wherein
   a diffuse reflection intensity of the dimming agent in a wavelength of from 400 nm to 750 nm is 80% or less:
   the dimming agent absorbs a part of light from the light-emitting element, and
   a phosphor comprising a same crystal matrix as that of the dimming agent, absorbs a part of light from the light-emitting element and converts the part of the light into light with an emission peak wavelength different from the peak wavelength of an emission wavelength of the light-emitting element.

\* \* \* \* \*